United States Patent
Vu et al.

[19]

[11] Patent Number: 5,974,361
[45] Date of Patent: Oct. 26, 1999

[54] WAVEFORM RECONSTRUCTION FROM DISTORTED (SATURATED) CURRENTS

[75] Inventors: Khoi Vu, Apex, N.C.; Aftab Khan, Expert, Pa.

[73] Assignee: ABB Power T&D Company Inc., Raleigh, N.C.

[21] Appl. No.: 08/967,134

[22] Filed: Nov. 10, 1997

[51] Int. Cl.$^6$ .................................................. G01R 23/20
[52] U.S. Cl. .............................. 702/69; 702/70; 702/191; 702/195; 702/126; 361/87; 324/620
[58] Field of Search .................................. 702/69, 66–68, 702/70–74, 105, 179, 182, 58, 59, 64, 65, 124, 126, 183, 185, 189–191, 194, 195, 198; 364/528.27–528.29, 724.011, 825, 826; 361/87, 88, 78, 79, 4, 7, 24, 30, 31, 35, 43, 57, 63, 65, 93; 324/620

[56] References Cited

U.S. PATENT DOCUMENTS

| | | | |
|---|---|---|---|
| 5,293,295 | 3/1994 | Nishitani | 364/528.28 |
| 5,343,404 | 8/1994 | Girgis | 702/72 |
| 5,629,869 | 5/1997 | Johnson et al. | 702/34 |
| 5,673,210 | 9/1997 | Etter | 702/69 |

*Primary Examiner*—Hal Dodge Wachsman
*Attorney, Agent, or Firm*—Woodcock Washburn Kurtz Mackiewicz & Norris LLP

[57] ABSTRACT

A method employed in a condition monitoring unit (CMU) for monitoring a circuit breaker or interrupter to obtain a substantially undistorted version of a waveform suffering from saturation distortion comprises employing a current transformer (CT) to measure a current waveform. The output of the CT is prone to be a partially distorted waveform. The invention is generic in the sense that it does not require parameters associated with the CT characteristics or with the burden impedance on the secondary side of the CT. A digital representation of the partially distorted waveform is obtained, and then undistorted portions of the partially distorted waveform are identified by comparing the amplitude of the partially distorted waveform within a sliding window to a pair of boundary values and identifying as undistorted those portions having an amplitude between the boundary values. Next, distorted portions of the waveform are separated from the undistorted portions, thereby yielding a data record with holes. Finally, a reconstructed waveform is formed by filling in the holes with data points representing an undistorted version of the observed waveform.

16 Claims, 2 Drawing Sheets

WAVEFORM RECONSTRUCTION FROM DISTORTED (SATURATED) CURRENTS

FIELD OF THE INVENTION

The present invention relates generally to an improved waveform reconstruction process and system, and more particularly to a process and system by which saturated parts of an input waveform are identified and discarded, leaving "holes" in the data record, and then the remaining data points are used in a curve-fitting procedure to fill the holes of the data record.

BACKGROUND OF THE INVENTION

The present invention is suited for, but not limited to, applications in electrical switching devices, e.g., in an intelligent circuit breaker having condition monitoring capability, in which it is necessary to employ measured current waveforms obtained by a current transformer (CT) or other saturating device to analyze the condition of the system being monitored. When a short circuit takes place on a power system, the resulting fault current contains a high-rms sine wave and a DC offset, forcing the current transformers to saturate. As a result, the observed current is distorted and adversely affects the accuracy of various numerical algorithms.

U.S. Pat. No. 5,629,869, May 13, 1997, entitled "Intelligent Circuit Breaker Providing Synchronous Switching and Condition Monitoring," discloses an intelligent circuit breaker having a means for monitoring and controlling the circuit breaker to improve its reliability and reduce maintenance costs. The disclosed condition monitoring unit (CMU) is capable of monitoring a variety of parameters associated with the circuit breaker, and to reduce maintenance costs through deferred maintenance and avoidance of unplanned outages by identifying impending failures before they occur. One example of an application in which the CMU utilizes measured currents obtained through a CT relates to the monitoring of contact and nozzle wear. Since contact and nozzle wear are a function of mechanism position and current, the required inputs are phase current from the CT secondary and mechanism position. For example, seven regions or cells of the interrupters are monitored for cumulative wear, and there is a specific mathematical expression for each of these cells that relates mechanism travel and arcing current to wear. This wear, expressed in "percent of useful life," is accumulated for each cell and stored in memory, and alarm set points are used to alert operating and maintenance personnel when the cells are approaching the end of their useful life.

A problem that occurs in systems that require accurate measurements of current waveforms is that the CT employed to measure current may become saturated, particularly when the input current has a DC offset, and therefore produce a distorted output. This well known phenomenon is illustrated in FIG. 2, which is considered in greater detail below in connection with the description of preferred embodiments of the present invention. Such saturation distortion can make the measured waveform inaccurate and unreliable, and so there is a need for a method and system for removing or correcting such distortion before the waveform is used in subsequent analyses. The present invention provides a waveform reconstruction method that recovers the undistorted waveform and can be used to enhance the accuracy of those analyses that use measured currents as inputs. The method is generic because it requires neither the CT excitation curve nor the circuit impedance (relay burden).

SUMMARY OF THE INVENTION

A primary goal of the present invention is to provide a method and system for removing the "saturation distortion" from a measured waveform, and to thus make the waveform a more useful and reliable measure of the actual current on which a subsequent analysis is to be based. According to one presently preferred embodiment of the invention, a method or system for use in an electrical apparatus wherein it is necessary to obtain a substantially undistorted version of a waveform that is prone to suffer from saturation distortion comprises the steps of, or means for, (a) transforming an observed waveform to obtain a measured waveform suffering from saturation distortion; (b) identifying undistorted portions of the measured waveform; (c) separating the distorted portions of the measured waveform from the undistorted portions thereof, whereby a data record with holes is obtained; and (d) forming a reconstructed waveform by filling in said holes with data points representing an undistorted version of the waveform.

In a presently preferred embodiment of the invention, step or element (a) is carried out with a CT and the distortion is a result of saturation of the CT. In addition, in step or element (b), the undistorted portions of the measured waveform are identified by comparing the amplitude of the measured waveform within a sliding window to a pair of boundary values and identifying as undistorted those portions having an amplitude between said boundary values. Further, in step or element (d), the holes are filled in with data points determined by interpolation.

Other features of the present invention are disclosed below.

DETAILED DESCRIPTION OF PREFERRED EMBODIMENTS

Figure 1:
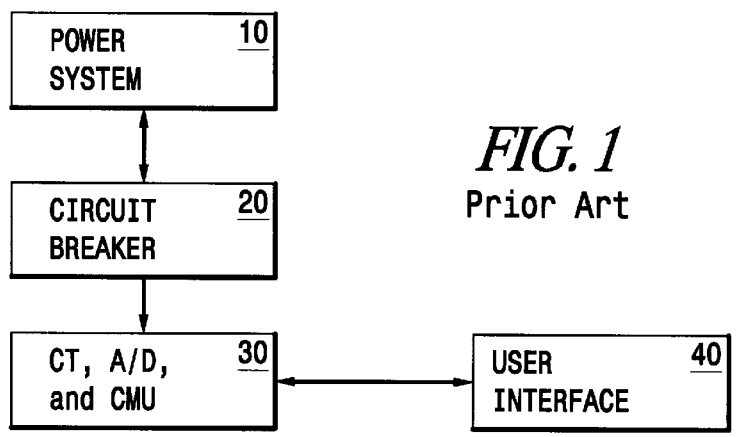
FIG. 1 schematically depicts a presently preferred environment in which the present invention may be used.

As mentioned above, the present invention may be advantageously employed in connection with a system of the type described U.S. Pat. No. 5,629,869. As illustrated in FIG. 1, an application such as this involves a power system 10, circuit breaker 20, CMU 30 and a user interface 40. Details of the CMU 30 are described in the above-cited patent and are not repeated here, except to the extent necessary to provide a good description of the inventive waveform reconstruction process. As noted in FIG. 1, the CMU includes, or is coupled to, a CT and an analog-to-digital convertor for digitizing the output waveform of the CT. It suffices to say that the CMU 30 relies on measured, digitized current waveforms in order to analyze the condition of the circuit breaker 20 and to provide a report via the user interface 40.

Figure 2:
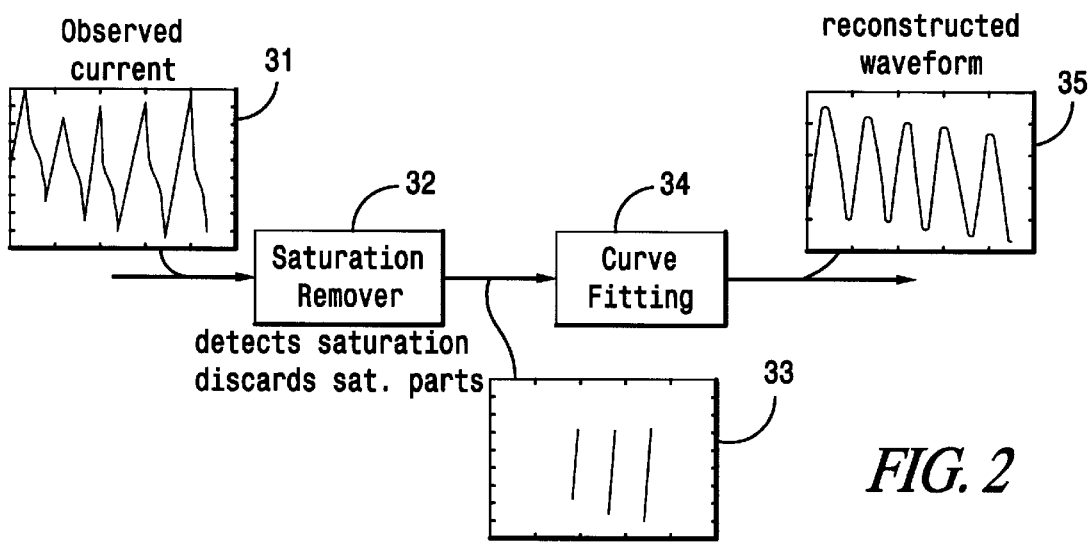
FIG. 2 schematically depicts a waveform reconstruction method and system in accordance with the present invention.

The waveform reconstruction method of the present invention involves two basic steps or elements, as shown in FIG. 2.

1. In the first step, saturated parts of the input waveform 31 are discarded by a "saturation remover" 32. This step leaves "holes" in the data record, as shown in the output waveform 33.

2. In the second step, the remaining data points are used in a curve-fitting procedure 34 that, through interpolation and extrapolation, fills the holes of the data record and provides a reconstructed waveform 35.

Of the two steps, the main challenge is in the saturation remover 32. This is because the amount of waveform distortion depends not only on the CT characteristic (i.e., output versus input curve) but also on the burden impedance. All of these factors are typically unknown, and therefore it is desired to have a method that works regardless of these circuit-specific features.

The curve-fitting procedure of the present invention is unlike conventional methods because the invention deals with data records with holes. Fortunately, as described below, the present invention can be implemented quite simply and is numerically stable. Provided the saturation remover 32 functions properly, the curve-fitting process 34 will return a highly accurate reconstructed waveform 35.

Saturation Remover

Figure 3:
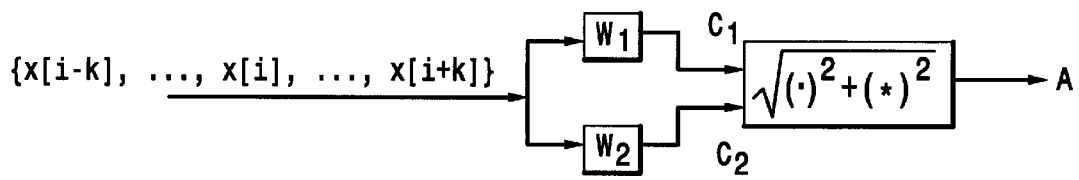
FIG. 3 schematically depicts an algorithm for tracking the amplitude "A" of an input waveform in order to distinguish unsaturated data from saturated data.

The block diagram of FIG. 3 depicts the overall process of tracking the amplitude "A" of the power-frequency (e.g., 60-Hz) component. The two boxes marked "$W_1$" and "$W_2$" refer to the weighting coefficients used to compute the in-phase and the quadrature components "$C_1$" and "$C_2$". "$W_1$" and "$W_2$" are chosen so that the dc offset component that exists in the data is filtered out. Note that 2k+1 data points centered around the index i are involved in the process, and therefore the data points run from x(i−k) to x(i+k). (These points should correspond to about one-fifth (⅕) of a cycle.) The center i can be varied, i.e., with a sliding window, to yield new values for the amplitude "A".

If the window slides over an unsaturated block of data, then the computed "A" is basically unchanged, and represents the true value of the 60-Hz amplitude. However, the value of "A" starts to fluctuate as the window enters the region of saturated data points. This fluctuation behavior can be exploited to distinguish unsaturated from saturated blocks in the data record.

One exemplary method to recognize blocks of unsaturated data involves comparing the computed value of the amplitude "A" to a lower bound and an upper bound. These bounds should be specified as a percentage of the "true" amplitude. However, since the true amplitude is not known in advance, heuristics are involved in selecting the bounds. By scanning through the data record, the highest value (in terms of absolute value) $|X_{max}|$ of the instantaneous current can be obtained. Since there is a correlation between $|X_{max}|$ and the true amplitude of the 60-Hz component, $|X_{max}|$ can be used to set the upper and lower bounds. It has been found, and verified by a large number of computer simulations, that the lower bound can be set to 70% and the upper bound to 200% of $|X_{max}|$.

Data point x(i) is considered an unsaturated point if the corresponding value of "A" (see FIG. 3) is between 70% and 200% of $|X_{max}|$. One more checking step is employed to prevent errors. Since unsaturated points always occur in contiguous blocks, one may check for blocks instead of isolated points. To achieve this, a counter can be used. The counter starts from 0 and increments every time the (2k+1)-point sliding window yields a value of "A" between the 70% and 200% bounds. The counter is reset to 0 when an out-of-bounds condition occurs. Thus, between two consecutive resets, the counter keeps track of a block of unsaturated data points. The block is chosen if the count exceeds a chosen threshold (i.e., if there are a sufficient number of undistorted data points) when resetting. Otherwise, the block is rejected. The process is continued until the end of the data record.

In the presently preferred implementation, a few additional features are added. Firstly, within each cycle of data points, all unsaturated blocks are scanned but only the largest block is retained. Secondly, since the record of fault current is likely to last for about three (3) cycles, at most three blocks (one for each cycle) are chosen. These three blocks are passed to the curve-fitting routine, which is described below.

The overall procedure for recognizing unsaturated data blocks is summarized below with pseudocode. The reader should note that, although specific numbers are given, these numbers may be modified to fit a given application.

Inputs:
an array of M data points (M=1500 is used)
sampling frequency fsamp (fsamp=10,000 Hz is used)
power-line frequency (f=60 Hz)
noise level(the noise due to the electronic circuit after the current is interrupted)
Output:
the reconstructed array.
Step 1: Mark where the noise begins.
Start at the end of the array x.
Go backwards.
Stop when ABS(x(i))>noise level.
Call this index "currentInterrupted".
(From now on, process only points from x(1) to x(currentInterrupted).)
Step 2: Scan the array x to determine its largest element "xMAX" in terms of ABS (absolute value).
Step 3: Mark the first block of unsaturated data points.
Concentrate on the points between x(1) and x(168).
(NOTE: This range would cover the first cycle.)
Let N=15. (This is roughly one-eleventh (1/11) of a cycle.)
Let minBlockSize=10.
Initialize: startOfBlock=N, and endOfBlock=N; FOR (i=N+1; I<=168−N; i++)
Take the window W centered at x(i) and of width 2N+1.
(this window contains the data points from x (i−N) to x (i+N).)
Fit window W with a combination of cosine and exponential.
From the fit, compute the amplitude cosAmpl of the cosine.
IF cosAmpl is reasonable (say, 0.7<cosAmpl/xMAX<2.0)
endOfBlock++
ELSE
IF endOfBlock−startOfBlock>=minBlockSize,
get out of the FOR loop.
ELSE
endOfBlock++
Set startOfBlock=endOfBlock.
END
Step 4: Mark the second block of unsaturated data points.
Initialize: startOfBlock2=endOfBlock; endOfBlock2=startOfBlock2.
Then repeat the FOR loop, as in Step 3.
FOR (i=startOfBlock2; i<=2cycles−N; i++)
Step 5: Mark the third block of unsaturated data points.
Initialize: startOfBlock3=endOfBlock2; endofBlock3=startOfBlock3.
Then repeat the FOR loop, as in Step 4.
FOR (i=startOfBlock3; i<=3 cycles−N and i<=currentInterrupted−N; i++).

Step 6: Scan the array x, from index i to index currentInterrupted:

Set element x(i) to maxVal (i.e., 32,767) if it does not belong to any of the three blocks.

Keep element x(i) unchanged if it belongs to one of the blocks.

The three blocks may be all empty. This occurs when the signal is severely distorted. In this case, return the array x unchanged; otherwise, continue with Step 7.

Step 7: Pass the array x to the curve fitting routine (see next section), which returns the reconstructed waveform.

Curve Fitting

After blocks of unsaturated data points are identified, the final stage of waveform reconstruction is launched. Two basic steps are involved here. The first step computes the unknown parameters $C_1$, $C_2$, B and $\lambda$ using the unsaturated data blocks. The second step simply replaces each point k of the data record by $C_1 \cos\omega k + C_2 \sin\omega k + B + \lambda k$. The first step is described further below.

Each data point x(k) of an unsaturated block satisfies C1cosωk+C2sinωk+B+λk=x(k). (The dc offset component $B^* \exp(\lambda k)$ is approximated as B+λk.) By concatenating all the points of the available blocks (suppose that we are using up to three blocks), we have $$\left[ \begin{array}{c} M_1 \\ \hline M_2 \\ \hline M_3 \end{array} \right] \times \left( \begin{array}{c} C_1 \\ C_2 \\ \lambda \\ B \end{array} \right) = \left[ \begin{array}{c} x_{block1} \\ \hline x_{block2} \\ \hline x_{block3} \end{array} \right]$$

For example, if blocks 1–3 contain 27, 50, and 68 points, respectively, then the matrix ($M_1$; $M_2$; $M_3$) is of size 145-by-4 and the x-vector is of size 145-by-1. Mathematically, the unknowns $C_1$, $C_2$, B and $\lambda$ can be found by performing the matrix operations of $(M^T M)^{-1} M^T x$, where M denotes the matrix ($M_1$; $M_2$; $M_3$) and x the collection of data points in the three unsaturated blocks. Note that the matrix ($M_1$; $M_2$; $M_3$) varies from case to case, and therefore it is not possible to compute the matrix $(M^T M)^{-1} M^T$ beforehand (i.e., at the time of computer programming). Another constraint that one must face is the limited memory of the embedded system. The paragraph below explains a simple method to solve the above matrix equation for the unknowns.

Observe that, regardless of the size of the unsaturated blocks, $M^T M$ is always a 4-by-4 matrix and $M^T x$ is always a 4-by-1 matrix. Therefore, only a 4-by-5 array is needed for temporary storage. Elements of this array are gradually upgraded as one moves from one unsaturated point to the next. When the upgrade is complete, the first 4 columns of the array correspond to $M^T M$ and the last column to $M^T x$. The Gaussian procedure of linear algebra (forward elimination and back substitution) can be applied to the array to yield the previously unknown parameters $C_1$, $C_2$, B and $\lambda$.

Figure 4:
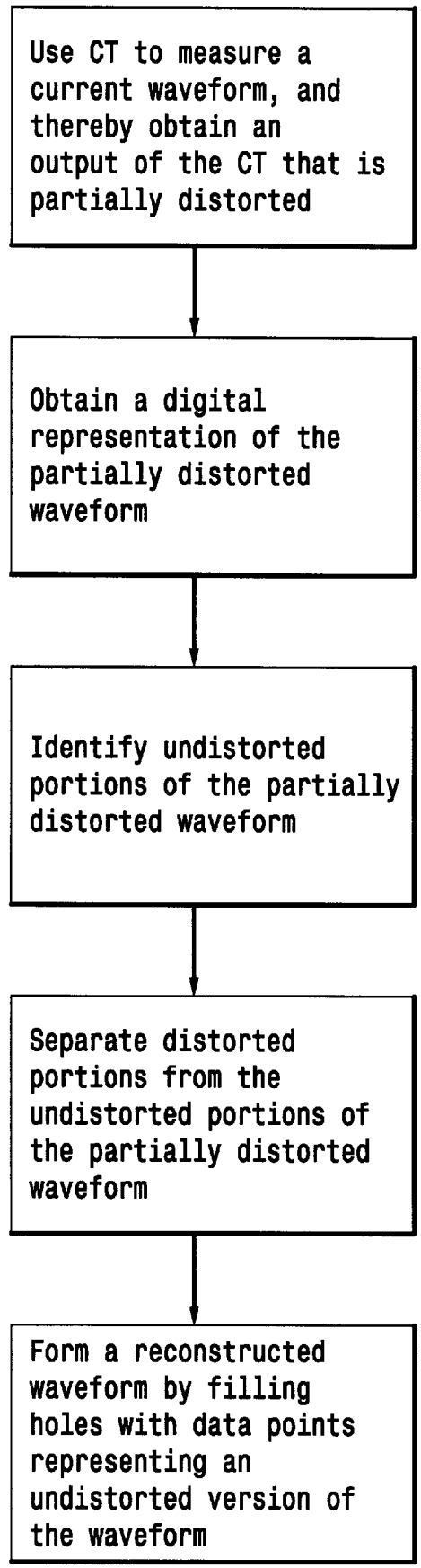
FIG. 4 is a flowchart of a presently preferred implementation of the waveform reconstruction method of the present invention.

The foregoing detailed description of the present invention is summarized in FIG. 4. As shown therein, the inventive method comprises the steps of employing a CT to measure a current waveform, wherein the output of the CT is a partially distorted waveform; obtaining a digital representation of the partially distorted waveform; identifying undistorted portions of the partially distorted waveform; separating distorted portions from the undistorted portions of the partially distorted waveform; and forming a reconstructed waveform by filling the holes with data points representing an undistorted version of the current waveform.

While the invention has been described and illustrated with reference to specific embodiments, those skilled in the art will recognize that modification and variations may be made without departing from the principles of the invention as described above and set forth in the following claims. For example, the foregoing description of the saturation remover assumes a sampling rate of 10,000 Hz and that up to 3 cycles of waveform data are available. If those assumed values are changed in a specific application, a different window size (N in Steps 3, 4 and 5) and/or a different number of blocks of unsaturated data points to be searched for can be selected. In addition, the saturation remover described above is designed to cope with a generic range of burden impedance connected to the secondary side of the CT. If, in a particular application, it is known that the burden is resistive (but with unknown resistance), the saturation remover can be made much simpler. In such a case, it is sufficient to retain either the rising or the falling edges of the waveform because the unsaturated data points coincide with these edges.

We claim:

1. A method for use in an electrical apparatus wherein it is necessary to obtain a substantially undistorted version of a waveform that is prone to suffer from saturation distortion, comprising the steps of:

(a) obtaining a measured waveform suffering from saturation distortion;

(b) identifying undistorted portions of the measured waveform;

(c) separating the distorted portions of the measured waveform from the undistorted portions thereof to obtain a data record with holes; and (d) forming a reconstructed waveform by filling in said holes with data points representing an undistorted version of the waveform.

2. A method as recited in claim 1, wherein step (a) is carried out with a current transformer (CT) and said saturation distortion is a result of saturation of said CT.

3. A method as recited in claim 1, wherein, in step (b), the undistorted portions of the measured waveform are identified by comparing the amplitude of the measured waveform within a sliding window to a pair of boundary values, and identifying as undistorted those portions having an amplitude between said boundary values.

4. A method as recited in claim 1, wherein, in step (d), said holes are filled in with data points determined by interpolation.

5. A method as recited in claim 1, wherein said electrical apparatus is a condition monitoring unit (CMU) for monitoring a circuit breaker or interrupter.

6. A method as recited in claim 1, wherein step (a) is carried out with a current transformer (CT) and said saturation distortion is a result of saturation of said CT; in step (b), the undistorted portions of the measured waveform are identified by comparing the amplitude of the measured waveform within a sliding window to a pair of boundary values, and identifying as undistorted those portions having an amplitude between said boundary values; and, in step (d), said holes are filled in with data points determined by interpolation.

7. A method as recited in claim 6, wherein said electrical apparatus is a condition monitoring unit (CMU) for monitoring a circuit breaker or interrupter.

8. A system for use in an electrical apparatus wherein it is necessary to obtain a true, or substantially undistorted, version of a waveform that is prone to suffer from saturation distortion, comprising the following elements:

(a) means for obtaining a measured waveform suffering from saturation distortion;

(b) means for identifying undistorted portions of the measured waveform;

(c) means for separating the distorted portions of the measured waveform from the undistorted portions thereof to obtain a data record with holes; and (d) means for forming a reconstructed waveform by filling in said holes with data points representing an undistorted version of the waveform.

9. A system as recited in claim 8, wherein element (a) comprises a current transformer (CT) and said saturation distortion is a result of saturation of said CT.

10. A system as recited in claim 8, wherein, in element (b), the undistorted portions of the measured waveform are identified by comparing the amplitude of the measured waveform within a sliding window to a pair of boundary values, and identifying as undistorted those portions having an amplitude between said boundary values.

11. A system as recited in claim 8, wherein, in element (d), said holes are filled in with data points determined by interpolation.

12. A system as recited in claim 8, wherein said electrical apparatus is a condition monitoring unit (CMU) for monitoring a circuit breaker or interrupter.

13. A system as recited in claim 8, wherein element (a) comprises a current transformer (CT) and said saturation distortion is a result of saturation of said CT; in element (b), the undistorted portions of the measured waveform are identified by comparing the amplitude of the measured waveform within a sliding window to a pair of boundary values, and identifying as undistorted those portions having an amplitude between said boundary values; and, in element (d), said holes are filled in with data points determined by interpolation.

14. A system as recited in claim 13, wherein said electrical apparatus is a condition monitoring unit (CMU) for monitoring a circuit breaker or interrupter.

15. A method employed in a condition monitoring unit (CMU) for monitoring a circuit breaker or interrupter to obtain a substantially undistorted version of a waveform suffering from saturation distortion, comprising the steps of:

(a) employing a current transformer (CT) to measure a current waveform, wherein an output of said CT is a partially distorted waveform;

(b) obtaining a digital representation of said partially distorted waveform;

(c) identifying undistorted portions of the partially distorted waveform by comparing the amplitude of the partially distorted waveform within a sliding window to a pair of boundary values, and identifying as undistorted those portions having an amplitude between said boundary values;

(d) separating distorted portions from the undistorted portions of the partially distorted waveform to obtain a data record with holes; and (e) forming a reconstructed waveform by filling in said holes with data points representing an undistorted version of the current waveform.

16. A method as recited in claim 15, wherein, in step (e), said holes are filled in with data points determined by interpolation.

* * * * *